US006605818B1

United States Patent
Cornog et al.

(10) Patent No.: US 6,605,818 B1
(45) Date of Patent: Aug. 12, 2003

(54) METHOD FOR PROTECTING AGAINST IONIZING RADIATION USING A SPRAYED PROTECTIVE COATING, AND A PROTECTED STRUCTURE

(75) Inventors: David G. Cornog, Los Angeles, CA (US); Kevin Tu, Torrance, CA (US); Roderick A. Bulante, Torrance, CA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 10/112,183

(22) Filed: Mar. 28, 2002

(51) Int. Cl.[7] ............................. H01J 1/52; H01J 29/46; G21C 11/00; G21F 1/00; G21F 3/04
(52) U.S. Cl. ............................. 250/518.1; 250/505.1; 250/515.1; 250/517.1
(58) Field of Search ............................. 250/505.1, 515.1, 250/517.1, 518.1

(56) References Cited

U.S. PATENT DOCUMENTS

| 3,777,367 | A | * | 12/1973 | Kalagidis ........................ 29/597 |
| 3,784,403 | A | * | 1/1974 | Glaski ........................ 427/253 |
| 3,892,651 | A | * | 7/1975 | Salisbury et al. ...... 204/192.12 |
| 4,025,661 | A | * | 5/1977 | Moscony et al. ............ 427/68 |
| 4,104,417 | A | * | 8/1978 | Sara ........................ 427/113 |
| 4,252,856 | A | * | 2/1981 | Sara ........................ 313/355 |
| 4,402,744 | A | * | 9/1983 | Sara ........................ 75/229 |
| 4,725,512 | A | * | 2/1988 | Scruggs ........................ 148/403 |
| 4,826,508 | A | * | 5/1989 | Schwartz et al. ............ 51/293 |
| 4,833,334 | A | | 5/1989 | Valy et al. |
| 5,411,611 | A | * | 5/1995 | Kumar et al. ............ 148/557 |
| 5,553,114 | A | * | 9/1996 | Siemers et al. ............ 378/128 |
| 5,811,050 | A | | 9/1998 | Gabower |
| 5,846,287 | A | * | 12/1998 | Kumar et al. ............ 428/576 |
| 6,261,508 | B1 | | 7/2001 | Featherby et al. |
| 6,405,979 | B1 | * | 6/2002 | Cordaro ................... 244/158 R |
| 6,455,864 | B1 | * | 9/2002 | Featherby et al. ....... 250/515.1 |
| 2002/0056791 | A1 | * | 5/2002 | Cordaro ........................ 244/163 |
| 2002/0148979 | A1 | * | 10/2002 | Featherby et al. ....... 250/515.1 |
| 2003/0025089 | A1 | * | 2/2003 | Featherby et al. ....... 250/515.1 |

OTHER PUBLICATIONS

Website: http://www.hps.org/publicinformation/ate/q1094.html/.*
Website: http://www.tpub.com/doematerialsci/materialscience54.htm/.*

* cited by examiner

Primary Examiner—John R. Lee
Assistant Examiner—Bernard E. Souw

(57) ABSTRACT

A housing and the structure within its interior is protected by spraying a protective coating overlying and contacting at least a portion of the housing. The protective coating is an ionizing radiation protective material such as a neutron-shielding material, a gamma-ray/X-ray shielding material, and a capture gamma-ray suppression material. The protective coating is at least about 0.020 inch thick.

20 Claims, 3 Drawing Sheets

METHOD FOR PROTECTING AGAINST IONIZING RADIATION USING A SPRAYED PROTECTIVE COATING, AND A PROTECTED STRUCTURE

This invention relates to the protection of electronic and other sensitive devices against the damaging effects of ionizing radiation, and more particularly, to a protective-coated housing that protects an enclosed electronic or other device.

BACKGROUND OF THE INVENTION

The space environment has high levels of ionizing radiation, such as cosmic rays, gamma rays, and hard X-rays. The ionizing radiation of space is largely attenuated by the atmosphere and magnetic field of the earth, and does not have a major effect at the surface of the earth. However, the ionizing radiation of space may degrade the performance of some types of devices that are flown in spacecraft in earth orbit or deep space missions and are exposed to the ionization radiation over extended periods of time. This degradation typically occurs in semiconductor-based devices when the ionizing radiation disrupts the microelectronic structure and/or processes.

Various techniques are known to reduce the damaging effects of the ionizing radiation on electronic devices in space. The electronic devices themselves may be hardened by altering their structures, but in some cases that approach is not feasible because it alters the functionality of the protected electronic device.

In another approach, the electronic devices are shielded against the effects of the ionizing radiation by a physical barrier which absorbs the ionizing radiation before it can reach the electronic device. The physical barrier usually includes a thickness of a protective material that absorbs and attenuates the ionizing radiation. In one form, the physical barrier is a housing that is made of the protective material or is coated with a composite material containing particles of the protective material embedded in an organic binder, see for example U.S. Pat. No. 4,833,334. In another form, the physical barrier is a conformal coating of the protective material embedded in an organic binder that is applied directly to the electronic device, see for example U.S. Pat. No. 6,261,508.

While these approaches are operable to various degrees, in cases they require that the protection be thicker and heavier than would be optimal. Those which construct the housing of the attenuating material require the providing and machining of large pieces of protective material, often an expensive proposition. Those which use an organic binder are subject to degradation of the binder over time and may require complex processing procedures. Care must be taken to choose organic materials that are not subject to excessive outgassing in space, while still being stable and having good adherence to the housing or package.

There is accordingly a need for an improved approach to the protection against ionizing radiation of electronic devices and other structure in a space environment. The present invention fulfills this need, and further provides related advantages.

SUMMARY OF THE INVENTION

The present invention provides a technique for protecting against ionizing radiation, a protective structure, and a protected structure. The present approach applies a protective coating overlying a fabricated housing. The protective coating does not contain organic binders or the like which can outgas or degrade over time. The housing is made to the required shape of materials of construction that are known in other situations. The coating is then applied overlying and contacting the housing, using application techniques that are known in other situations and which are relatively inexpensive. The present approach minimizes the weight and thickness of the protective material that must be used to achieve a selected level of protection.

In accordance with the invention, a method comprises the steps of providing a housing, and spraying a protective coating overlying and contacting at least a portion of the housing. The protective coating comprises at least one ionizing radiation protective material selected from the group consisting of a neutron-shielding material, a gamma-ray/X-ray shielding material, and a capture gamma-ray suppression material. Examples of neutron-shielding materials are iron and copper; examples of gamma-ray/X-ray shielding materials are tungsten, hafnium, tantalum, and lead; examples of capture gamma-ray suppression materials are boron and lithium. The spraying is preferably accomplished by plasma spraying the protective coating, most preferably air plasma spraying or vacuum plasma spraying. Multiple layers of different ionizing radiation protective materials may be sprayed to form the protective coating. This technique produces an adherent, coherent coating on many types of materials that may be used in the housing.

The protective coating is typically sprayed to a thickness exceeding about 0.020 inches, preferably from about 0.020 to about 0.200, and most preferably from about 0.030 to about 0.050 inches, to achieve sufficient attenuating effect against the ionizing radiation. Where there are multiple layers of different ionizing radiation protective materials, each layer is typically of the indicated thickness. An important advantage of the present spray approach is that the thickness of the protective coating may be readily selected, and it may be varied spatially in different areas of the housing according to the amount of protection that is required.

The housing is typically made of a material such as a metal, a ceramic, or a nonmetallic composite material. A metal housing, such as an aluminum-alloy housing, is preferred. The sprayed protective coating is preferably applied over substantially all of the housing, but in some cases it may be applied only over portions of the housing.

An electronic or other type of device sensitive to ionizing radiation is normally placed within and enclosed by the housing with its protective coating. This housing, with its protective coating, and the enclosed electronic device are thereafter exposed to a space environment, in a preferred application.

A structure comprises a housing, and a protective coating of an ionizing radiation protective material overlying and contacting at least a portion of the housing. The protective coating has a sprayed microstructure and comprises at least one ionizing radiation protective material selected from the group consisting a neutron-shielding material, a gamma-ray/X-ray shielding material, and a capture gamma-ray suppression material. Other aspects of the invention as discussed herein may be used in conjunction with the structure.

The structure of the present invention achieves good protection against ionizing radiation in a space environment, or against high-energy radiation in other environments as well. The nature and amount of protection are readily controlled by selecting the materials in the protective coating and the thickness of the protective coating to be as required for the expected exposure conditions. The weight of the structure is no greater than necessary, and the cost of fabricating the housing with the protective coating thereon is relatively inexpensive. The sprayed protective coating adheres well to most housing materials, and the organic-free protective coating does not outgas or degrade over time.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
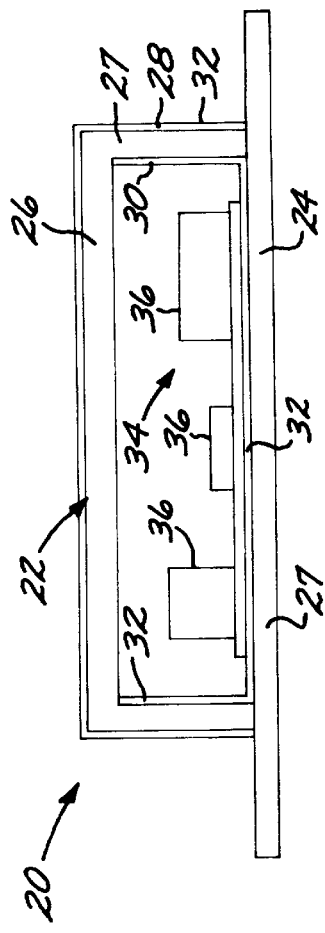
FIG. 1 is a sectional view of a structure including the housing with its protective structure, and the electronic device therein.

FIG. 1 depicts a structure 20 including a housing 22 having a base 24 and a lid 26. The housing 22 includes a wall 27 with an outside surface 28 and an inside surface 30. A protective coating 32 overlies and contacts at least a portion of the housing 22, but preferably all of the housing 22 is coated either on its outside surface 28, its inside surface 30, or both. As illustrated, where it is present the protective coating 32 may overlie and contact only the outside surface 28 in some regions, only the inside surface 30 in some regions, or both the outside surface 28 and the inside surface 30 in some regions. The thickness of the protective coating 32 may vary between regions, and may be uniformly thick or nonuniformly thick. In some cases, some regions of the housing may have no protective coating 32 thereon. One of the advantages of the present approach is that the protective coating 32 may readily be applied in various regions and with various thicknesses.

At least one article 34 is enclosed within the housing 22. Preferably, the article 34 is an electronic device 36 or other device sensitive to ionizing radiation, but it may be other types of articles as well. The protective coating 32 serves as a barrier to protect the article 34 against radiation from external sources.

Figure 2:
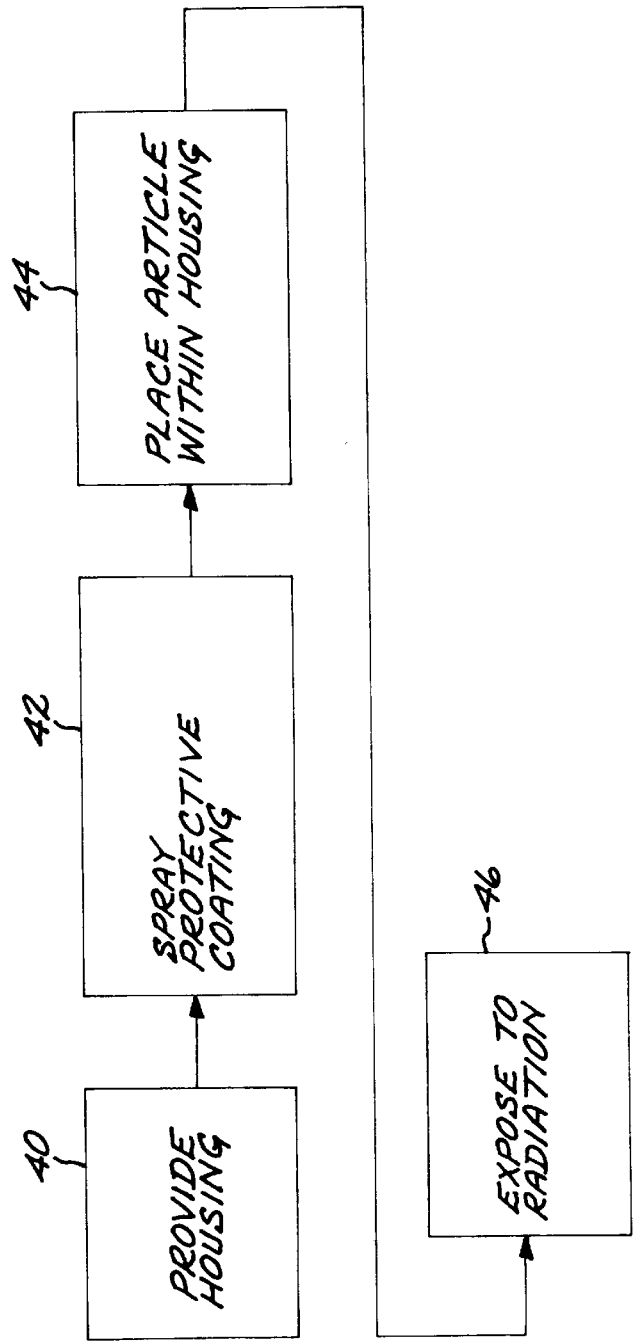
FIG. 2 is a block flow diagram of an approach for practicing the present invention.

An approach for preparing and using the structure 20 is illustrated in FIG. 2. The housing 22 is provided, numeral 40. The housing 22 is sized to enclose the article or articles 34. The housing 22 may be made of any operable material, such as an aluminum alloy, a ceramic, or a suitable metallic or nonmetallic composite material. An aluminum alloy is presently preferred. The wall 27 of the housing 22 is sufficiently thick to provide the required mechanical strength to support itself, the article 34, the protective coating 32, and any mechanical or electrical interconnections.

Figure 3:
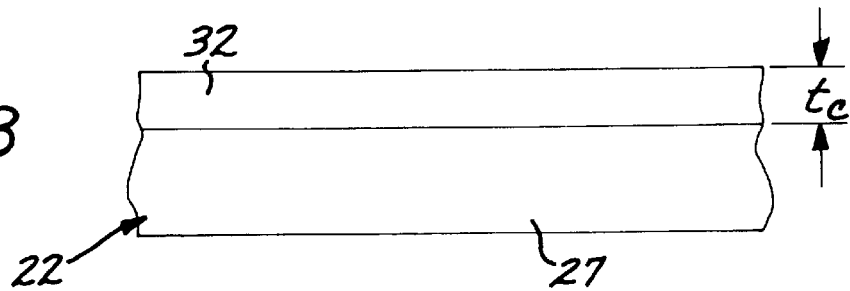
FIG. 3 is a detail of the housing and a first embodiment of the protective structure.
Figure 4:
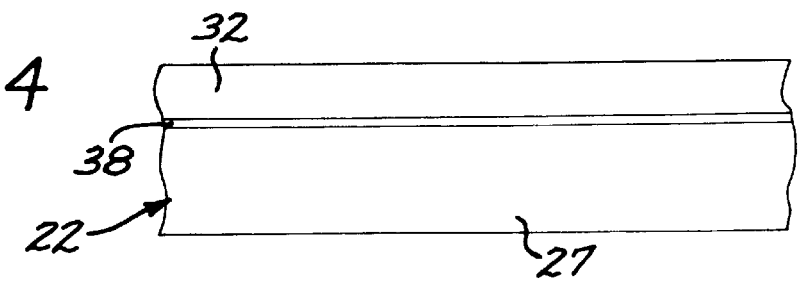
FIG. 4 is a detail of the housing and a second embodiment of the protective structure.

The protective coating 32 is sprayed onto the wall 27 of the housing 22, numeral 42. FIG. 3 illustrates the protective coating 32 of thickness $t_C$ overlying and contacting the wall 27 of the housing 22. In some instances, the protective coating 32 does not adhere well to the material that forms the housing 22. In that case, as shown in FIG. 4, a thin additive layer 38 may be applied first to the wall 27, and then the protective coating 32 applied overlying additive layer 38. Both of these embodiments of FIGS. 3 and 4 are within the scope of "overlying and contacting" as used herein. The additive layer 38 may be an electrically conductive metal such as aluminum or copper, in those instances where the wall 27 of the housing 22 is not an electrical conductor, to distribute electrical charge and conduct it to ground.

The protective coating 32 comprises at least one ionizing radiation protective material selected from the group consisting of a neutron-shielding material, a "gamma-ray/X-ray" shielding material, and a capture gamma-ray suppression material. Such materials are known in the art in relation to other shielding approaches. Examples of a neutron-shielding material include iron and copper; examples of a gamma-ray/X-ray shielding material include tungsten, hafnium, tantalum, and lead; and examples of a capture gamma-ray suppression material include boron and lithium. Other shielding materials such as those disclosed in U.S. Pat. No. 6,261,508, whose entire disclosure is incorporated by reference, may be utilized. (As used herein, naming a material includes the material in both its pure and its alloyed form. For example, "iron" includes both substantially pure iron and alloys of iron with other elements.) These materials may be applied as mixtures of different ionizing radiation protective materials as well, so that a single layer of the protective material may include ionizing radiation protective materials of different types. In other cases, the ionizing radiation protective material may be mixed with a metal that is not an ionizing radiation protective material, in which the ionizing radiation protective material is embedded in its deposited state. For example, if the ionizing radiation protective material has a high melting point that is not readily melted by the spray process, it may be mixed with a lower melting point metal that is melted in the spray process. Tungsten and its alloys are most preferred as the protective coating 32 for the case of the gamma-ray/X-ray shielding material. These materials of construction of the protective coating 32 absorb and attenuate the major components of the ionizing radiation, when provided in a sufficient thickness.

Figure 5:
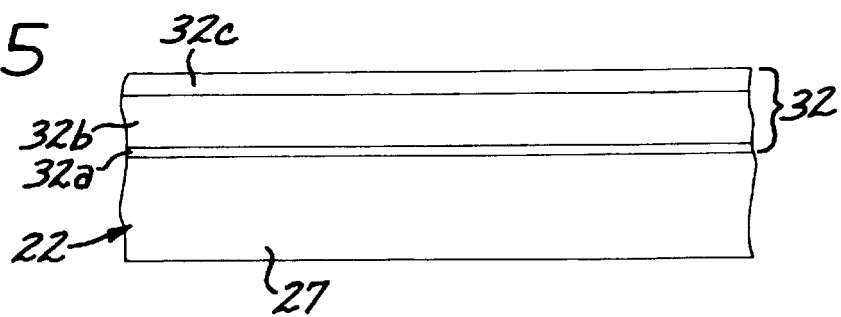
FIG. 5 is a detail of the housing and a third embodiment of the protective structure.

An advantage of the present spray application step 42 is that it may be practiced to produce a single protective coating 32 or multiple subcoatings within the coating 32. FIG. 5 depicts a protective coating 32 having three protective subcoatings 32a, 32b, and 32c. Typically, the protective subcoatings 32a, 32b, and 32c are of different ones of the ionizing radiation protective materials, as discussed earlier. For example, the protective subcoating 32a might be a neutron-shielding material, the protective subcoating 32b might be a gamma-ray/X-ray shielding material, and the protective subcoating 32c might be a capture gamma-ray suppression material. Each subcoating has a thickness sufficient to perform its individual shielding function. In a variation of the embodiment shown in FIG. 5 where the subcoatings 32a, 32b, and 32c are deposited one upon the other, some of the subcoatings could be deposited upon the outside surface 28 and some of the subcoatings could be deposited upon the opposing inside surface 30 of the wall 27, all of the overlying subcoatings being taken collectively as the coating 32.

The protective coating 32 must be of sufficient thickness to provide the necessary protective and attenuating effect that shields the article 34 from external radiation. This thickness may vary according to the type of mission in space that is to be performed. A solar mission, a low-earth-orbit mission, a high-earth-orbit mission, and a deep space outer planetary mission may require different thicknesses $t_C$ of the protective coating 32. In general, however, the protective coating must be thicker than are electrically conductive coatings that are used to protect against electromagnetic interference (EMI). Such EMI coatings typically need only be continuous and of sufficient thickness to ensure continuity. EMI coatings are typically about 0.005 inches thick or less, and in many cases about 0.002 inches thick or less. In the case of the protective coating 32, which attenuates the external radiation as a function of its thickness, the minimum thickness $t_C$ must exceed about 0.020 inch, preferably is from about 0.020 to about 0.200 inch, and most preferably is from about 0.030 to about 0.050 inch. Thinner coatings do not have sufficient protective effect. A coating having a thickness greater than about 0.200 is more economically provided by other techniques, in most cases does not provide any added protection, and only adds unnecessary weight.

The protective coating 32 is applied by a spray process. The preferred spray processes are plasma spray processes. Most preferably, the protective coating 32 is applied by air plasma spray (APS) conducted at about atmospheric pressure or vacuum plasma spray (VPS) conducted in a reduced pressure. Such techniques are known in the art for other applications, and will be described only briefly here.

Figure 6:
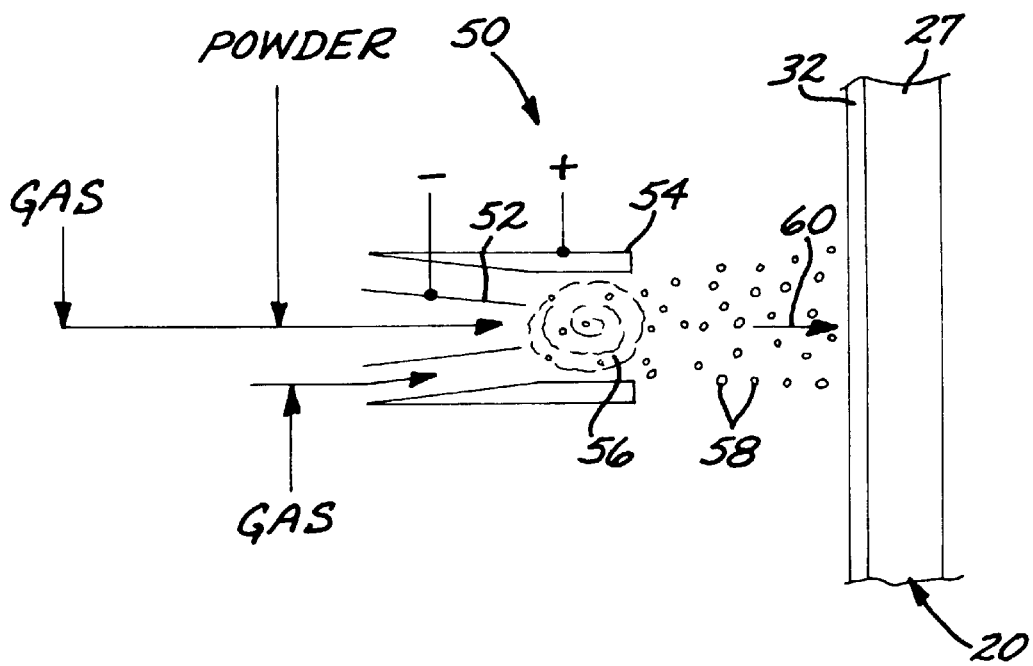
FIG. 6 is a schematic illustration of a plasma spray process.

FIG. 6 schematically depicts a plasma spray process using a spray head 50. A spray gas such as argon is fed into a central channel 52 of the spray head 50, along with a powder of the material to be plasma sprayed. A voltage applied between the central tube 52 and an outer channel 54 creates a plasma 56. (There are many ways to create the plasma 56, with an applied voltage being only one of those.) A further gas flow may be introduced between the central channel 52 and the outer channel 54. The fluidized flow of powder enters the plasma 56 from the central channel 52, and the powder is at least partially melted to form particles 58 that are propelled toward the wall 27 of the housing 22 in a direction of deposit 60. The first-sprayed particles 58 impact the wall 27, and then subsequent sprayed particles 58 impact the gradually thickening deposit that eventually becomes the protective coating 32. The deposition may be in air or vacuum. In air plasma spraying, an inert shield gas may be used to minimize oxidation of the sprayed particles 58.

Figure 7:
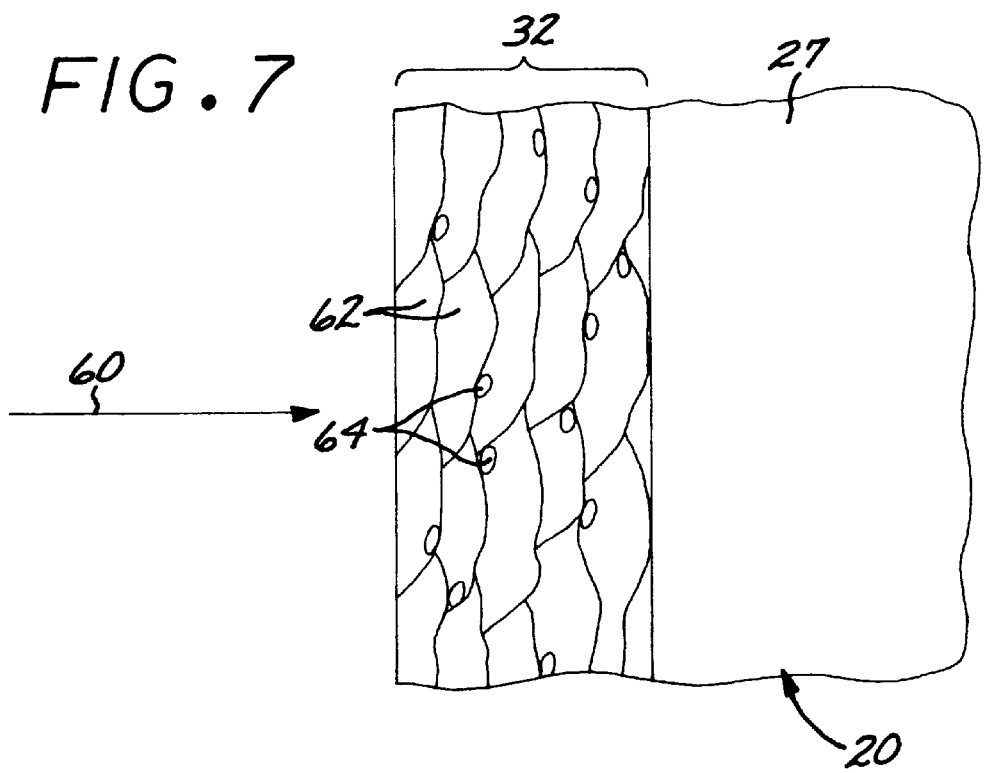
FIG. 7 is a microstructure of the protective structure.

Because of this spray mode of deposition, the protective coating 32 has a distinctive microstructure illustrated in an idealized form in FIG. 7. The protective coating 32 is formed of a plurality of grains 62. In many cases, each grain 62 corresponds to one of the individual particles 58. The grains 62 are distinctively flattened in a pancake-like fashion perpendicular to the direction of deposit 60, as a result of the flattening of the particles 58 when they impact the solid surface at a high velocity. Multiple phases may be present, depending upon the nature of the powder mix that is sprayed. Because in the usual case the particles 58 are not fully melted, there is some porosity 64 in the as-deposited microstructure because the deformation of the particles 58 at impact does not fill all of the space with the underlying grain 62. The porosity 64 may be reduced by sintering or hot isostatic pressing the as-spray-deposited structure, but such further processing is typically not required for the present application. The sprayed protective coating 32 has substantially no organic material present in the form of a binder, either during application or in its final form. There may be a small amount of organic contamination present, but even that is of a low level due to the elevated-temperature spray deposition.

Referring again to FIG. 2, the article 34, illustrated in FIG. 1 to be the protected electronic device 36, is placed into the housing 22, numeral 44. This positioning of the electronic device 36 within the housing is facilitated by making the housing 22 in the form of the base 24 and the lid 26. The electronic device 36 is supported on the base 24, electrically interconnected as necessary, and then the lid 26 is placed over the electronic device 36 and fastened in place. The housing 22 usually has provision for electrical feedthroughs of any operable type for connection to the electronic device 36.

Lastly, and optionally but preferably, the housing 22 with the protective coating 32 thereon, and the electronic device 36 therein, is exposed to a space environment. The space environment may be either in space, or a simulated space environment for testing purposes.

The present invention has been reduced to practice using the approach of steps 40 and 42 of FIG. 2. A housing having a size of about 30 inches×30 inches×4 inches and made of aluminum alloy was air plasma sprayed with a protective coating of tungsten about 0.037 thick.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method comprising the steps of
   providing a housing; and
   spraying a protective coating overlying and contacting at least a portion of the housing, the protective coating comprising at least one ionizing radiation protective material selected from the group consisting of a neutron-shielding material, a gamma-ray or X-ray shielding material, and a capture gamma-ray suppression material, wherein the protective coating has substantially no organic binder therein.

2. The method of claim 1, herein the step of spraying includes the step of providing a neutron-shielding material.

3. The method of claim 1, herein the step of spraying includes the step of providing a neutron-shielding material selected from the group consisting of iron and copper.

4. The method of claim 1, herein the step of spraying includes the step of providing a gamma-ray or X-ray shielding material.

5. The method of claim 1, herein the step of spraying includes the step of providing a gamma-ray or X-ray shielding material selected from the group consisting of tungsten, hafnium, tantalum, and lead.

6. The method of claim 1, herein the step of spraying includes the step of providing a capture gamma-ray suppression material.

7. The method of claim 1, herein the step of spraying includes the step of providing a capture gamma-ray suppression material selected from the group consisting of boron and lithium.

8. The method of claim 1, wherein the step of spraying includes the step of
   plasma spraying the protective coating.

9. The method of claim 1, wherein the step of spraying includes the step of
   spraying the protective coating to a thickness exceeding about 0.020 inch.

10. The method of claim 1, wherein the step of spraying includes the step of spraying the protective coating to a thickness of from about 0.020 inch to about 0.200 inch.

11. The method of claim 1, wherein the step of spraying includes the step of applying the protective coating comprising at least two layers, each layer of a different ionizing radiation protective material.

12. The method of claim 1, wherein the step of providing the housing includes the step of providing the housing comprising a material selected from the group consisting of a metal, a ceramic, and a nonmetallic composite material.

13. The method of claim 1, wherein the step of providing the housing includes the step of providing the housing comprising an aluminum alloy.

14. The method of claim 1, wherein the step of spraying includes the step of spraying the protective coating to overlie substantially all of the housing.

15. The method of claim 1, including an additional step of placing an electronic device within the housing.

16. The method of claim 15, including an additional step of exposing the housing with the protective coating thereon and the electronic device therein to a space environment.

17. A method comprising the steps of providing a housing;

plasma spraying a protective coating of an ionizing radiation protective material overlying and contacting at least a portion of the housing, the protective coating having a thickness of at least about 0.020 inch, and wherein the protective coating has substantially no organic binder therein; and placing an electronic device within the housing.

18. The method of claim 17, including an additional step of exposing the housing with the protective coating thereon and the electronic device therein to a space environment.

19. A structure comprising:

a housing; and a protective coating of an ionizing radiation protective material overlying and contacting at least a portion of the housing, the protective coating having a sprayed microstructure and comprising at least one ionizing radiation protective material selected from the group consisting a neutron-shielding material, a gamma-ray or X-ray shielding material, and a capture gamma-ray suppression material, wherein the protective coating has substantially no organic binder therein.

20. The structure of claim 19, further including an electronic device contained within the housing.

* * * * *

UNITED STATES PATENT AND TRADEMARK OFFICE
CERTIFICATE OF CORRECTION

PATENT NO. : 6,605,818 B1
DATED : August 12, 2003
INVENTOR(S) : David G. Cornog, Kevin Tu and Roderick A. Bulante It is certified that error appears in the above-identified patent and that said Letters Patent is hereby corrected as shown below:

<u>Column 1,</u>
Line 5, add:

-- FEDERALLY SPONSORED RESEARCH OR DEVELOPMENT
This Invention was made with government support under Contract No. N00039-88-C-0300 awarded by the Department of Navy. The government may have certain rights in this invention. --

Signed and Sealed this

Seventh Day of September, 2004

JON W. DUDAS
*Director of the United States Patent and Trademark Office*